United States Patent
Choi et al.

(10) Patent No.: US 10,998,466 B2
(45) Date of Patent: May 4, 2021

(54) LIGHT EMITTING DEVICE

(71) Applicant: LG INNOTEK CO., LTD., Seoul (KR)

(72) Inventors: Kwang Yong Choi, Seoul (KR); Min Sung Kim, Seoul (KR); Su Ik Park, Seoul (KR); Youn Joon Sung, Seoul (KR); Yong Gyeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 157 days.

(21) Appl. No.: 16/083,710

(22) PCT Filed: Mar. 8, 2017

(86) PCT No.: PCT/KR2017/002487
§ 371 (c)(1),
(2) Date: Sep. 10, 2018

(87) PCT Pub. No.: WO2017/155294
PCT Pub. Date: Sep. 14, 2017

(65) Prior Publication Data
US 2019/0088822 A1    Mar. 21, 2019

(30) Foreign Application Priority Data

Mar. 11, 2016  (KR) .................... 10-2016-0029516

(51) Int. Cl.
*H01L 33/24*  (2010.01)
*H01L 33/38*  (2010.01)
(Continued)

(52) U.S. Cl.
CPC .............. *H01L 33/24* (2013.01); *H01L 33/38* (2013.01); *H01L 33/382* (2013.01); *H01L 33/40* (2013.01);
(Continued)

(58) Field of Classification Search
CPC ..... H01L 33/24; H01L 33/382; H01L 33/387; H01L 33/38
See application file for complete search history.

(56) References Cited

U.S. PATENT DOCUMENTS 8,008,683 B2 *  8/2011  Choi ....................... H01L 33/08
                                                          257/99
8,373,193 B2 *  2/2013  Kim ...................... H01L 33/405
                                                          257/79
(Continued)

FOREIGN PATENT DOCUMENTS

EP        2 728 631 A1    5/2014
JP        2014-195055 A  10/2014
(Continued)

OTHER PUBLICATIONS

CRC Hand of Chemistry and Physics, 95th ed. 2015, pp. 12-206-207 (Year: 2015).*
(Continued)

*Primary Examiner* — Shih Tsun A Chou
(74) *Attorney, Agent, or Firm* — KED & Associates LLP

(57) ABSTRACT

An embodiment relates to a light emitting device comprise a second electrode which includes indium tin oxide (ITO), an ohmic characteristic between a second semiconductor layer and the second electrode is improved and a driving voltage is also improved. An embodiment relates to a light emitting device comprise a capping layer that can overlap the second semiconductor layer with the second electrode interposed therebetween and include a material of which a difference in thermal expansion coefficient with the second semiconductor layer is 3 or less. Therefore, since the capping layer is electrically connected to the second electrode, delamination and lifting of an interface between the second (Continued)

electrode and the second semiconductor layer is prevented, and reliability of the light emitting device is improved.

16 Claims, 7 Drawing Sheets

(51) Int. Cl.
   *H01L 33/40* (2010.01)
   *H01L 33/62* (2010.01)
   *H01L 33/22* (2010.01)
(52) U.S. Cl.
   CPC .............. *H01L 33/62* (2013.01); *H01L 33/22* (2013.01); *H01L 2933/0016* (2013.01)

(56) References Cited

U.S. PATENT DOCUMENTS

| | | | | |
|---|---|---|---|---|
| 8,772,803 B2* | 7/2014 | Jeong | ................ | H01L 33/40 |
| | | | | 257/103 |
| 9,300,111 B2* | 3/2016 | Lee | ..................... | H01S 5/02 |
| 2013/0113007 A1* | 5/2013 | Choi | .................... | H01L 33/382 |
| | | | | 257/98 |
| 2014/0239341 A1 | 8/2014 | Matsumura | | |
| 2017/0133563 A1* | 5/2017 | Chung | .................... | H01L 33/56 |

FOREIGN PATENT DOCUMENTS

| | | | |
|---|---|---|---|
| JP | 2015-177023 A | | 10/2015 |
| KR | 10-2013-0112330 A | | 10/2013 |
| KR | 10-2014-0009649 A | | 1/2014 |

OTHER PUBLICATIONS

Reeber et al., Lattice Parameters and Thermal Expansion of Important Semiconductors and Their Substrates, Mat. Res. Soc. Symp. vol. 622, pp. T6.35.1-6 (Year: 2000).*
Wikipedia, Ultraviolet, archived Jan. 4, 2015 (Year: 2015).*
Konig et al., Electrically Tunable Plasmonic Behavior of NanocubePolymer Nanomaterials Induced by a Redox-Active Electrochromic Polymer, ACS NANO, vol. 8, No. 6, 6192-6192, 2014 (Year: 2014).*
International Search Report (with English Translation) and Written Opinion dated May 29, 2017 issued in Application No. PCT/KR2017/002487.

* cited by examiner

LIGHT EMITTING DEVICE

CROSS-REFERENCE TO RELATED PATENT APPLICATIONS

This application is a U.S. National Stage Application under 35 U.S.C. § 371 of PCT Application No. PCT/KR2017/002487, filed Mar. 8, 2017, which claims priority to Korean Patent Application No. 10-2016-0029516, filed Mar. 11, 2016, whose entire disclosures are hereby incorporated by reference.

TECHNICAL FIELD

The present invention relates to a light emitting device with improved reliability.

BACKGROUND ART

A light emitting diode (LED) is one of light emitting devices which emit light when a current is applied thereto. The LED has a high energy reduction effect because of emitting high efficiency light at low voltage. Recently, since a brightness of the LED is significantly improved, the LED is applied to various devices such as a backlight unit of a liquid crystal display device, an electric signboard, an indicator, and a home appliance.

An LED includes a light emitting structure having a first semiconductor layer, an active layer, and a second semiconductor layer, and a first electrode and a second electrode which are respectively in contact with the first semiconductor layer and the second semiconductor layer of the light emitting structure. Particularly, in a vertical light emitting device, a first semiconductor layer, an active layer, and a second semiconductor layer are selectively etched to form a groove through which a first electrode may be electrically connected to a first semiconductor layer.

Here, in the light emitting device, indium tin oxide (ITO) may be directly formed on the second semiconductor layer to improve an ohmic characteristic between the second electrode and the second semiconductor layer and a driving voltage. In addition, in the light emitting device, after a capping layer is formed on the ITO, an insulating layer, which covers the capping layer and exposes the first electrode, may be formed.

Here, since an interface between the ITO and the second semiconductor layer is a junction between a metal and a semiconductor, there is a problem in that the metal and the semiconductor are easily separated. In addition, the insulating layer formed under the capping layer is lifted, and thus contact failures may occur at electrodes which will be formed later, a substrate, and the like.

DISCLOSURE

Technical Problem

The present invention is directed to providing a light emitting device with an improved ohmic characteristic, an improved driving voltage, and improved reliability.

Technical Solution

One aspect of the present invention provides a light emitting device including: a support substrate; a light emitting structure disposed on the support substrate and including a first semiconductor layer, a second semiconductor layer, and an active layer interposed between the first semiconductor layer and the second semiconductor layer; at least one groove which passes through the second semiconductor layer and the active layer and exposes the first semiconductor layer; a first electrode interposed between the light emitting structure and the support substrate and electrically connected to the exposed first semiconductor layer; a second electrode which includes indium tin oxide (ITO) and is in contact with the second semiconductor layer; and a capping layer interposed between the first electrode and the light emitting structure and electrically connected to the second electrode, wherein the capping layer is disposed to face the second semiconductor layer with the second electrode interposed therebetween and includes a first layer having a material of which a difference in thermal expansion coefficient with the second semiconductor layer is 3 or less.

The groove may include a bottom surface, and a side surface which extends from the bottom surface and exposes the first semiconductor layer, the active layer, and the second semiconductor layer.

An insulating layer may be interposed between the first electrode and the second electrode and may electrically insulate the first electrode from the second electrode.

The insulating layer may include a first insulating layer disposed on the side surface; and a second insulating layer interposed between the first insulating layer and the first electrode.

The second insulating layer may surround the capping layer, the second electrode, and the first insulating layer.

The second electrode may cover a part of the first insulating layer.

The first electrode may include a contact electrode in contact with the exposed first semiconductor layer, and a bonding electrode interposed between the capping layer and the support substrate and electrically connected to the contact electrode.

The contact electrode may be disposed to be spaced apart from the first insulating layer.

a separation distance between the contact electrode and the first insulating layer may be in a range of 0.5 µm to 2 µm.

The second electrode may be interposed between the capping layer and the second semiconductor layer.

The first layer may include chromium (Cr);

The capping layer may include the first layer, a second layer, and a third layer, wherein the second layer and the third layer are sequentially stacked on the first layer, and the third layer may be closer to the support substrate than the first layer.

The second layer may include a material selected among gold (Au), platinum (Pt), and copper (Cu).

The third layer may include titanium (Ti).

The light emitting device may further include barrier layers between the first layer and the second layer and between the second layer and the third layer.

The barrier layers may include nickel (Ni).

A thickness of the second electrode may be 200 nm or less.

A thickness of the first layer may be in a range of 1 nm to 50 nm.

The first electrode may be electrically insulated from the second electrode and the capping layer.

The support substrate may be electrically connected to the second electrode.

Advantageous Effects

A light emitting device according to the present invention has the following effects.

First, in the light emitting device according to the embodiment of the present invention, since a second electrode includes indium tin oxide (ITO), an ohmic characteristic between a second semiconductor layer and the second electrode is improved and a driving voltage is also improved.

Second, a capping layer can overlap the second semiconductor layer with the second electrode interposed therebetween and include a material of which a difference in thermal expansion coefficient with the second semiconductor layer is 3 or less. Therefore, since the capping layer is electrically connected to the second electrode, delamination and lifting of an interface between the second electrode and the second semiconductor layer is prevented, and reliability of the light emitting device is improved.

MODES OF THE INVENTION

Figure 1:
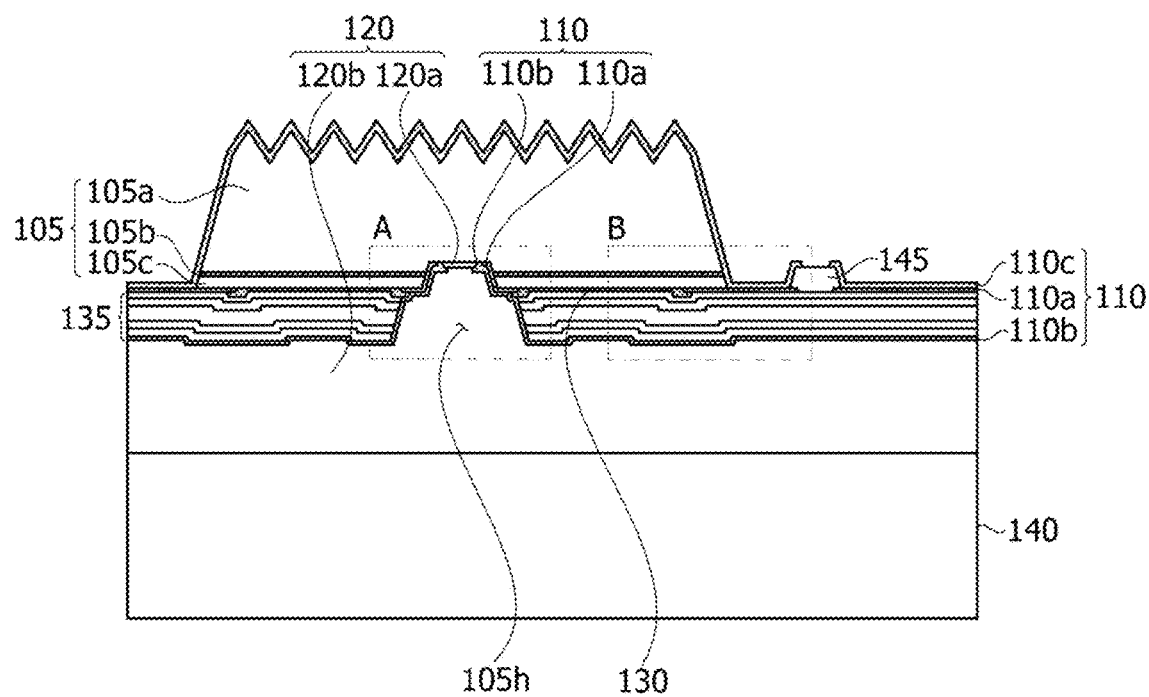
FIG. 1 is a cross-sectional view illustrating a light emitting device according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited by these terms. These terms are only used to distinguish one element from another. For example, a first element could be termed a second element, and a second element could similarly be termed a first element without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements.

The terminology used herein is for the purpose of describing particular embodiments only and is not intended to be limiting to the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Example embodiments of the invention will be described below in more detail with reference to the accompanying drawings. The same or corresponding components are denoted by the same reference numeral regardless of the drawing number, and redundant explanations are omitted.

Hereinafter, the light emitting device according to the embodiment will be described in detail with reference to the accompanying drawings.

Figure 2A:
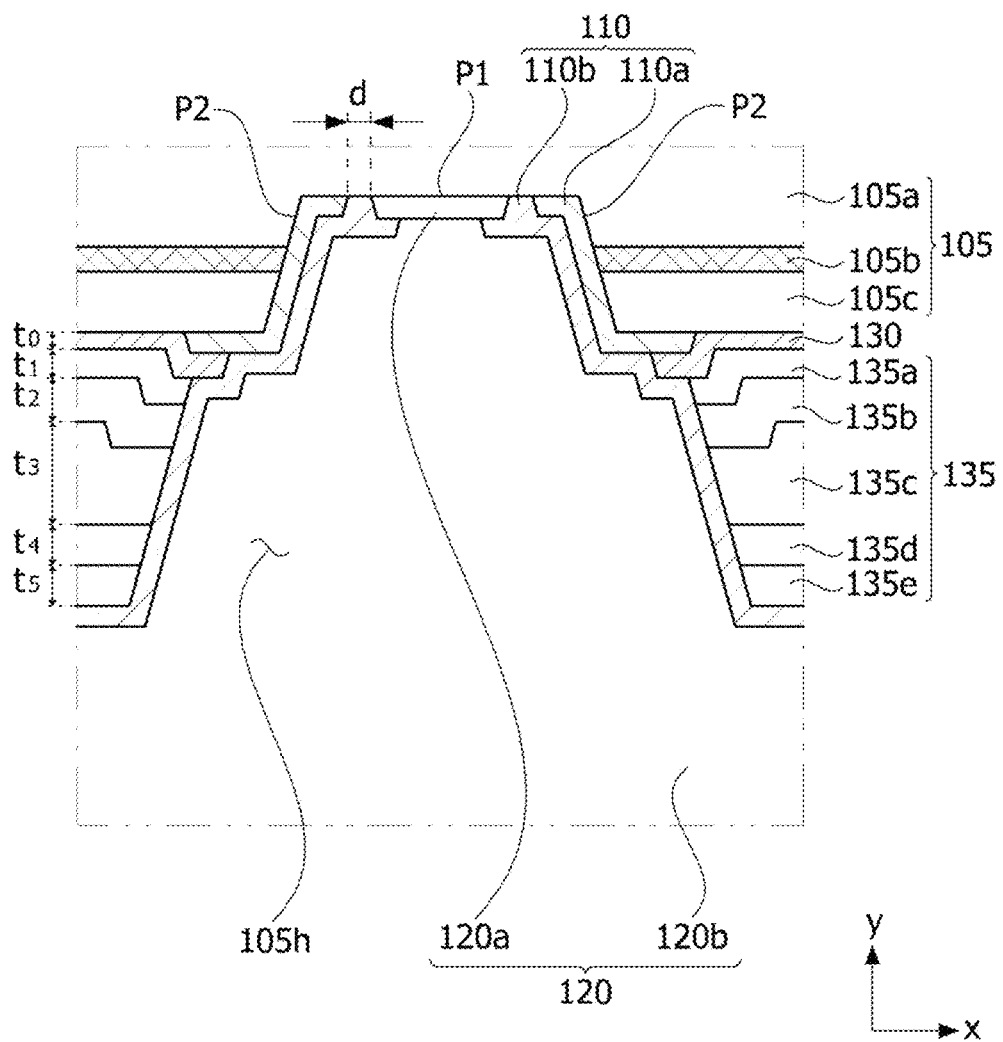
FIG. 2A is an enlarged view illustrating a region A of FIG. 1.
Figure 2B:
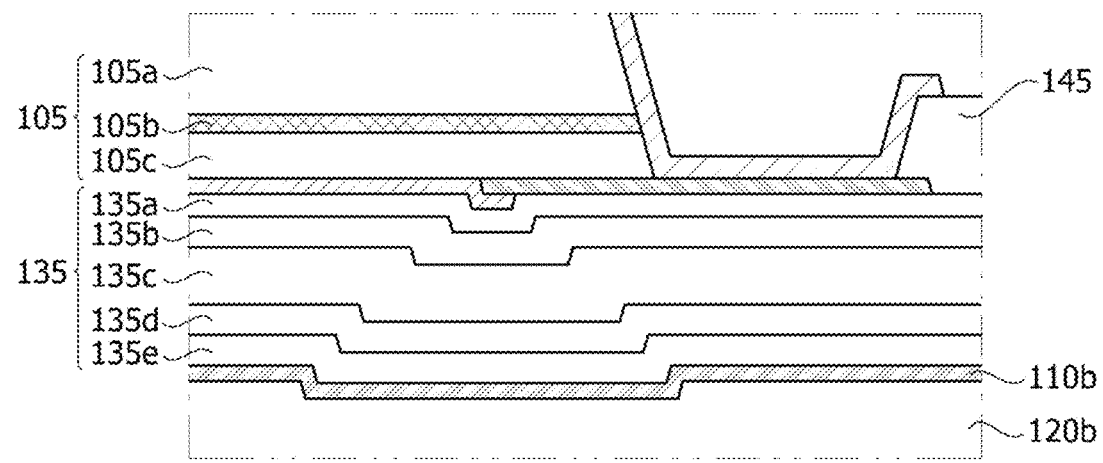
FIG. 2B is an enlarged view illustrating a region B of FIG. 1.

FIG. 1 is a cross-sectional view illustrating a light emitting device according to an embodiment of the present invention, FIG. 2A is an enlarged view illustrating a region A of FIG. 1, and FIG. 2B is an enlarged view illustrating a region B of FIG. 1.

As illustrated in FIG. 2, the light emitting device according to the embodiment of the present invention includes a light emitting structure 105 disposed on a support substrate 140 and having a first semiconductor layer 105a, an active layer 105b, and a second semiconductor layer 105c, a first electrode 120 electrically connected to the first semiconductor layer 105a, a second electrode 130 in contact with the second semiconductor layer 105c and including indium tin oxide (ITO), and a capping layer 135 interposed between the first electrode 120 and the light emitting structure 105 and electrically connected to the second electrode 130, and the capping layer 135 includes a first layer 135a disposed to face the second semiconductor layer 105c with the second electrode 130 interposed therebetween and including a material of which a difference in thermal expansion coefficient with the second semiconductor layer 105c is 3 or less.

The light emitting structure 105 may be disposed at an upper portion of the light emitting device and include the first semiconductor layer 105a, the second semiconductor layer 105c, and the active layer 105b interposed between the first semiconductor layer 150a and the second semiconductor layer 105c.

The first semiconductor layer 105a may be formed of a Group V or VI compound semiconductor and the like, and the first semiconductor layer 105a may be doped with a first dopant. The first semiconductor layer 105a may be formed of a semiconductor material having a composition formula of $Al_xIn_yGa_{(1-x-y)}N$ ($0 \leq x \leq 1$, $0 \leq y \leq 1$, $0 \leq x+y \leq 1$), but is not limited thereto. In a case in which the first dopant is an N-type dopant such as Si, Ge, Sn, Se, Te, and the like, the first semiconductor layer 105a doped with the first dopant may be an N-type semiconductor layer.

In a case in which the light emitting device according to the embodiment of the present invention is an ultraviolet (UV) light emitting device, a deep UV light emitting device, or a non-polarized light emitting device, the first semiconductor layer 105a may include at least one of InAlGaN and AlGaN. In addition, the first semiconductor layer 105a may include graded AlGaN in which a concentration gradient of aluminum is present to reduce a lattice difference. The first semiconductor layer 105*a* may have a single layer or multilayer structure, and has the single layer structure as illustrated in the drawings.

The active layer 105*b* may be interposed between the first semiconductor layer 105*a* and the second semiconductor layer 105*c*. The active layer 105*b* is a layer in which electrons (or holes) injected through the first semiconductor layer 105*a* meet holes (or electrons) injected through the second semiconductor layer 105*c*. The electrons and holes are recombined in the active layer 105*b* and transitioned to a lower energy level so that the active layer 105*b* can generate light having a corresponding wavelength.

The active layer 105*b* may have any one structure among a single well structure, a multi well structure, a single quantum well structure, a multi quantum well (MQW) structure, a quantum dot structure, and a quantum line structure, but the structure of the active layer 105*b* is not limited thereto.

In a case in which the active layer 105*b* is formed to have a well structure, a well layer/barrier layer of the active layer 105*b* may be formed to have any one or more pair structures among InGaN/GaN, InGaN/InGaN, GaN/AlGaN, InAlGaN/GaN, GaAs(InGaAs)/AlGaAs, and GaP(InGaP)/AlGaP, but is not limited thereto. The well layer may be formed of a material having a band gap less than that of the barrier layer.

The second semiconductor layer 105*c* may be formed of a Group V or VI compound semiconductor, and the like, and the second semiconductor layer 105*c* may be doped with a second dopant. The second semiconductor layer 105*c* may be formed of a semiconductor material having a composition formula of $In_xAl_yGa_{(1-x-y)}N$ ($0 \leq x \leq 1$, $0 \leq y \leq 1$, $0 \leq x+y \leq 1$). In a case in which the second dopant is a P-type dopant such as Mg, Zn, Ca, Sr, Ba, and the like, the second semiconductor layer 105*c* doped with the second dopant may be a P-type semiconductor layer.

The light emitting structure 105 according to the embodiment of the present invention may include the first semiconductor layer 105*a* which is the N-type semiconductor layer and the second semiconductor layer 105*c* which is the P-type semiconductor layer, or include the first semiconductor layer 105*a* which is the P-type semiconductor layer and the second semiconductor layer 105*c* which is the N-type semiconductor layer. In addition, the light emitting structure 105 may have a structure in which the N-type or P-type semiconductor layer is further formed between the second semiconductor layer 105*c* and the active layer 105*b*.

That is, the light emitting structure 105 according to the embodiment of the present invention may be formed to have at least any one among np, pn, npn, and pnp junction structures, and the light emitting structure 105 according to the embodiment of the present invention may have one of various structures including the N-type semiconductor layer and the P-type semiconductor layer.

Doping concentrations of impurities in the first semiconductor layer 105*a* and the second semiconductor layer 105*c* may be uniform or non-uniform. That is, a doping structure of the light emitting structure 105 may be variously formed, but is not limited.

A roughness pattern may be formed on an upper surface, in which light emits, of the light emitting structure 105 to diffuse light emitted by the light emitting device. The roughness pattern may be uniform or non-uniform as illustrated in the drawing, and may be formed onto a side surface of the light emitting structure 105.

A groove 105*h* may be formed in a lower surface of the light emitting structure 105. At least one groove 105*h* may be formed. The groove 105*h* may electrically connect the first semiconductor layer 105*a* and the first electrode 120.

The groove 105*h* may be a structure in which the light emitting structure 105 is selectively removed. The groove 105*h* may pass through the second semiconductor layer 105*c* and the active layer 105*b*, and a partial region of the first semiconductor layer 105*a* may be etched to form the groove 105*h*.

The groove 105*h* may include a bottom surface P1 which exposes the first semiconductor layer 105*a* and a side surface P2 which exposes the first semiconductor layer 105*a*, the active layer 105*b*, and the second semiconductor layer 105*c*. An insulating layer may be disposed on the side surface P2 of the groove 105*h*.

An insulating layer 110 may electrically isolate the first electrode 120 from the second electrode 130. In addition, the insulating layer 110 may include a first insulating layer 110*a* and a second insulating layer 110*b*.

The first insulating layer 110*a* may be disposed on the side surface of the groove 105*h*, and the second insulating layer 110*b* may surround the first insulating layer and may be interposed between the first insulating layer 110*a* and the first electrode 120.

The first insulating layer 110*a* may cover parts of the first semiconductor layer 105*a*, the active layer 105*b*, and the second semiconductor layer 105*c*.

The first insulating layer 110*a* may prevent the first electrode 120 from being in direct contact with the active layer 105*b* and the second semiconductor layer 105*c*, and also prevent the second electrode 130 from being in contact with the first semiconductor layer 105*a* and the active layer 105*b*.

The first insulating layer 110*a* may include $SiO_2$, $Si_xO_y$, $Si_3N_4$, $Si_xN_y$, $SiO_xN_y$, $Al_2O_3$, $TiO_2$, AlN, and the like, but is not limited thereto.

The second insulating layer 110*b* may be disposed to surround the capping layer 135, the second electrode 130, and the first insulating layer 110*a*. The second insulating layer 110*b* will be described in detail when the capping layer 135 is described.

In addition, the first electrode 120 may be in direct contact with the exposed first semiconductor layer 105*a* at the bottom surface P1 of the groove 105*h*. The first electrode 120 may include a contact electrode 120*a* disposed on the bottom surface P1 of the groove 105*h*, and a bonding electrode 120*b* which connects contact electrodes 120*a* formed in grooves 105*h*. In addition, the contact electrode 120*a* may be disposed on the bottom surface P1 of the groove 105*h*. Here, as illustrated in FIG. 2A, the contact electrode 120*a* may be spaced a predetermined distance from the first insulating layer 110*a* in consideration of process margins of the contact electrode 120*a* and the first insulating layer 110*a*.

Generally, after the first insulating layer 110*a* is formed, the contact electrode 120*a* electrically connected to the first semiconductor layer 105*a* exposed through the first insulating layer 110*a* is formed. However, in a case in which a gap d between the contact electrode 120*a* and the first insulating layer 110*a* is not sufficient, the contact electrode 120*a* may fully cover the first insulating layer 110*a* due to the process margin of the contact electrode 120*a* so that one end of the contact electrode 120*a* may extend to the second semiconductor layer 105*c*.

In addition, in the case in which the gap d between the contact electrode 120*a* and the first insulating layer 110*a* is not sufficient, the second insulating layer 110*b* and the like, which will be described below, do not sufficiently fill the gap d between the contact electrode 120a and the first insulating layer 110a so that the first semiconductor layer 105a may be exposed. Accordingly, a low current failure of the light emitting device may occur, and thus reliability may be degraded. Accordingly, the gap d between the contact electrode 120a and the first insulating layer 110a may be in the range of 0.5 µm to 2 µm, but is not limited thereto.

The contact electrode 120a may be in direct contact with the first semiconductor layer 105a and may be formed of a material having a high contact characteristic. For example, the contact electrode 120a may be formed of a metal such as Au, Sn, In, Ag, Ni, Nb, Cu, and the like or an alloy thereof, but is not limited thereto.

In addition, the bonding electrode 120b may be interposed between the capping layer 135 and the support substrate 140.

In addition, the bonding electrode 120b may be formed of Ag, Ni, Al, Rh, Pd, Ir, Ru, Mg, Zn, Pt, Au, Hf, or a selective combination thereof. The bonding electrode 120b may be formed of a reflective material having an ohmic characteristic and have a single layer or multilayer. The bonding electrode 120b may include the metal and at least one among ITO, indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni/$IrO_x$/Au, and Ni/$IrO_x$/Au/ITO, but is not limited thereto.

The second electrode 130 is in direct contact with the second semiconductor layer 105c and may include ITO. However, when the second electrode 130 including the ITO is too thick, the second electrode 130 may absorb light emitted from the active layer 105b so that light emitting performance of the light emitting device may be degraded. Accordingly, a thickness $t_0$ of the second electrode 130 may be 200 nm or less, but is not limited thereto. In addition, the second electrode 130 may cover a part of the first insulating layer 110a.

In the light emitting device according to the embodiment of the present invention, since the second electrode 130 includes the ITO, an ohmic characteristic between the second semiconductor layer 105c and the second electrode 130 may be improved, and thus a contact characteristic can be improved. Accordingly, a driving voltage of the light emitting device can be improved.

The capping layer 135 may be interposed between the support substrate 140 and the light emitting structure 105. In addition, the bonding electrode 120b may be interposed between the capping layer 135 and the support substrate 140.

The capping layer 135 may be electrically connected to the second electrode 130 to diffuse carriers injected from an electrode pad 145 and to reflect light generated by the active layer 105b.

The capping layer 135 may be a structure in which a plurality of layers are stacked. As illustrated in FIG. 2B, the capping layer 135 may be a structure in which first to fifth layers are sequentially stacked.

The capping layer 135 may be insulated from the bonding electrode 120b by the second insulating layer 110b.

The first layer 135a may be direct contact with the second electrode 130. The first layer 135a may be disposed to face the second semiconductor layer 105c with the second electrode 130 interposed therebetween. That is, the first layer 135a may be disposed closest to the second semiconductor layer 105c among the plurality of layers of the capping layer 135.

Here, in a case in which a difference in thermal expansion coefficient between the first layer 135a and the second semiconductor layer 105c is too large, when depositing the second insulating layer 110b, a problem of delamination of an interface between the second electrode 130 and the second semiconductor layer 105c occurs. That is, since a surface of the second insulating layer 110b is lifted due to the delamination of the interface between the second electrode 130 and the second semiconductor layer 105c, reliability of the light emitting device may be degraded.

FIGS. 3A to 3D are images in which lifting occurs in the light emitting device.

Figure 3A:
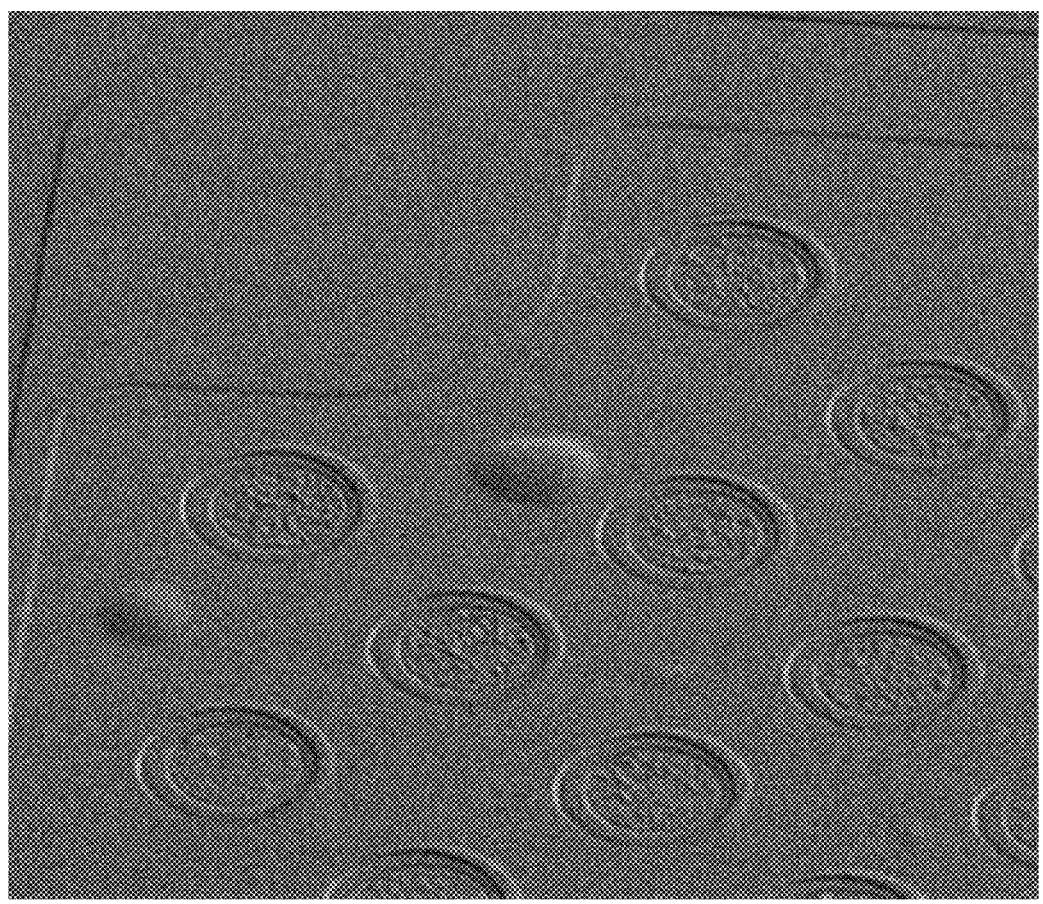
FIGS. 3A to 3D are images in which lifting occurs in the light emitting device.
Figure 3B:
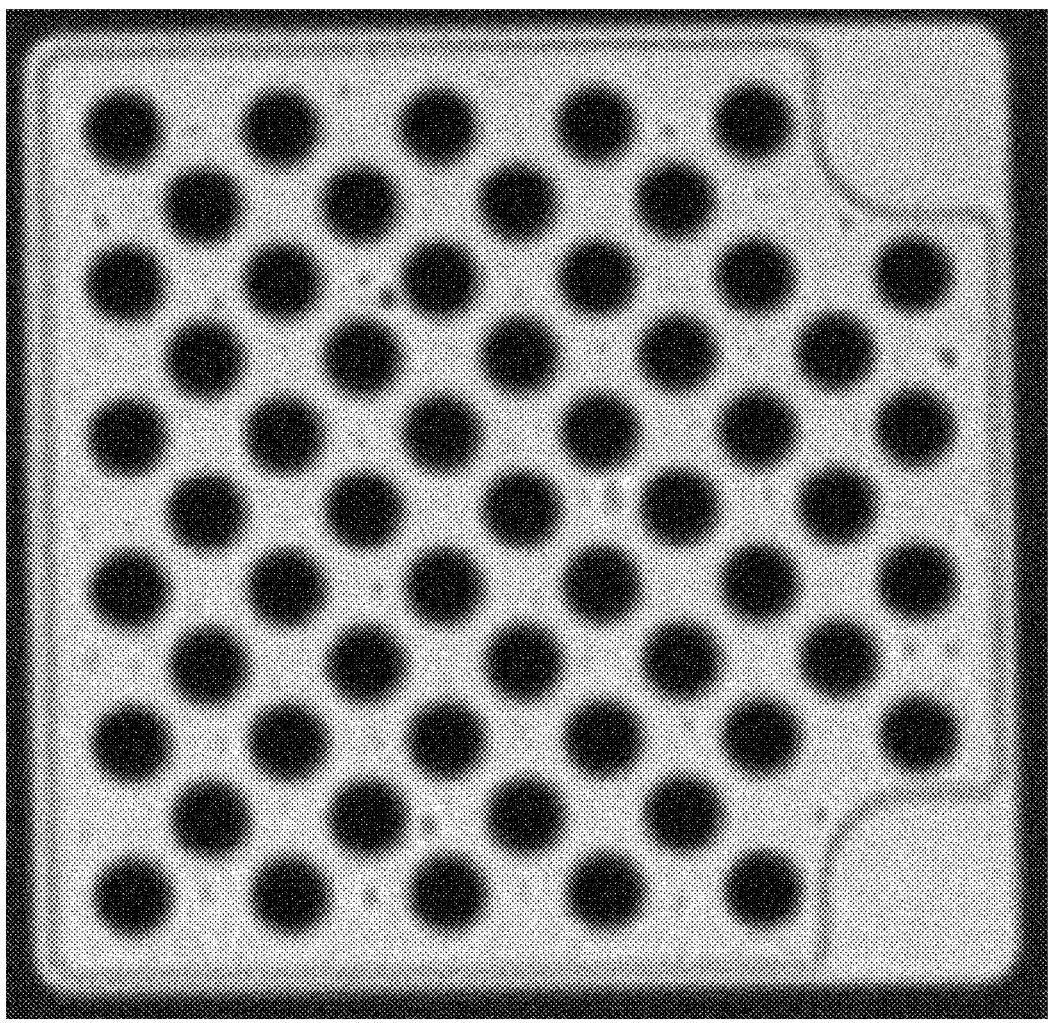
Figure 3C:
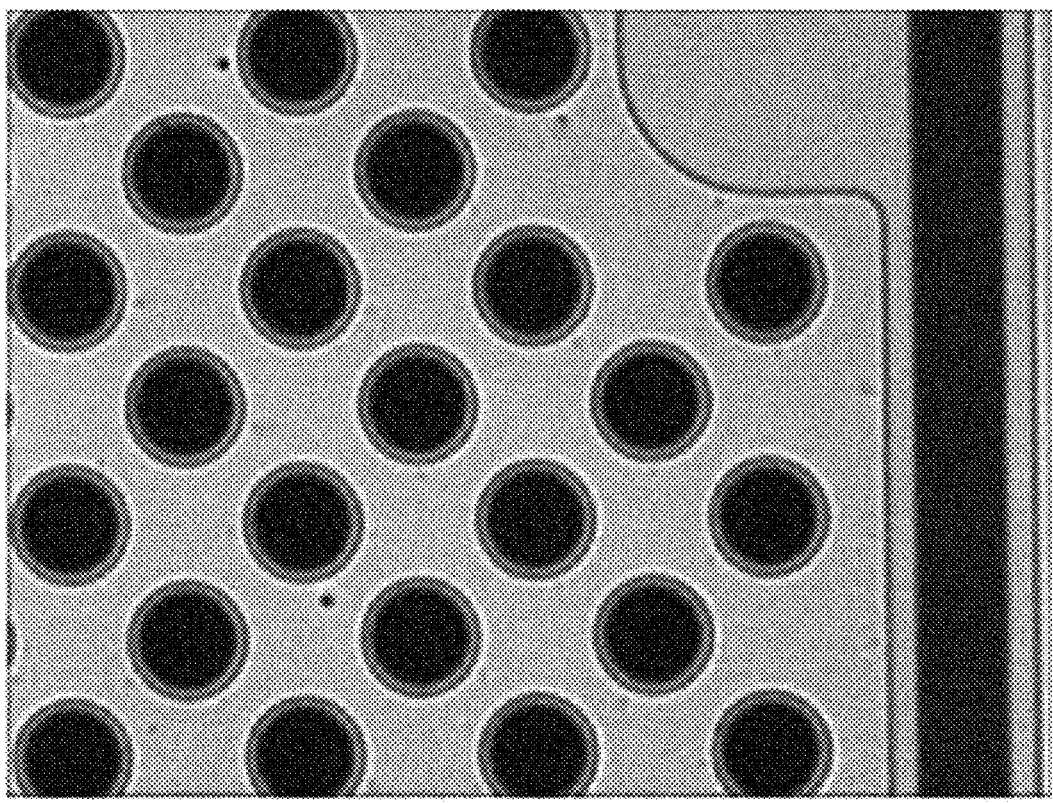
Figure 3D:
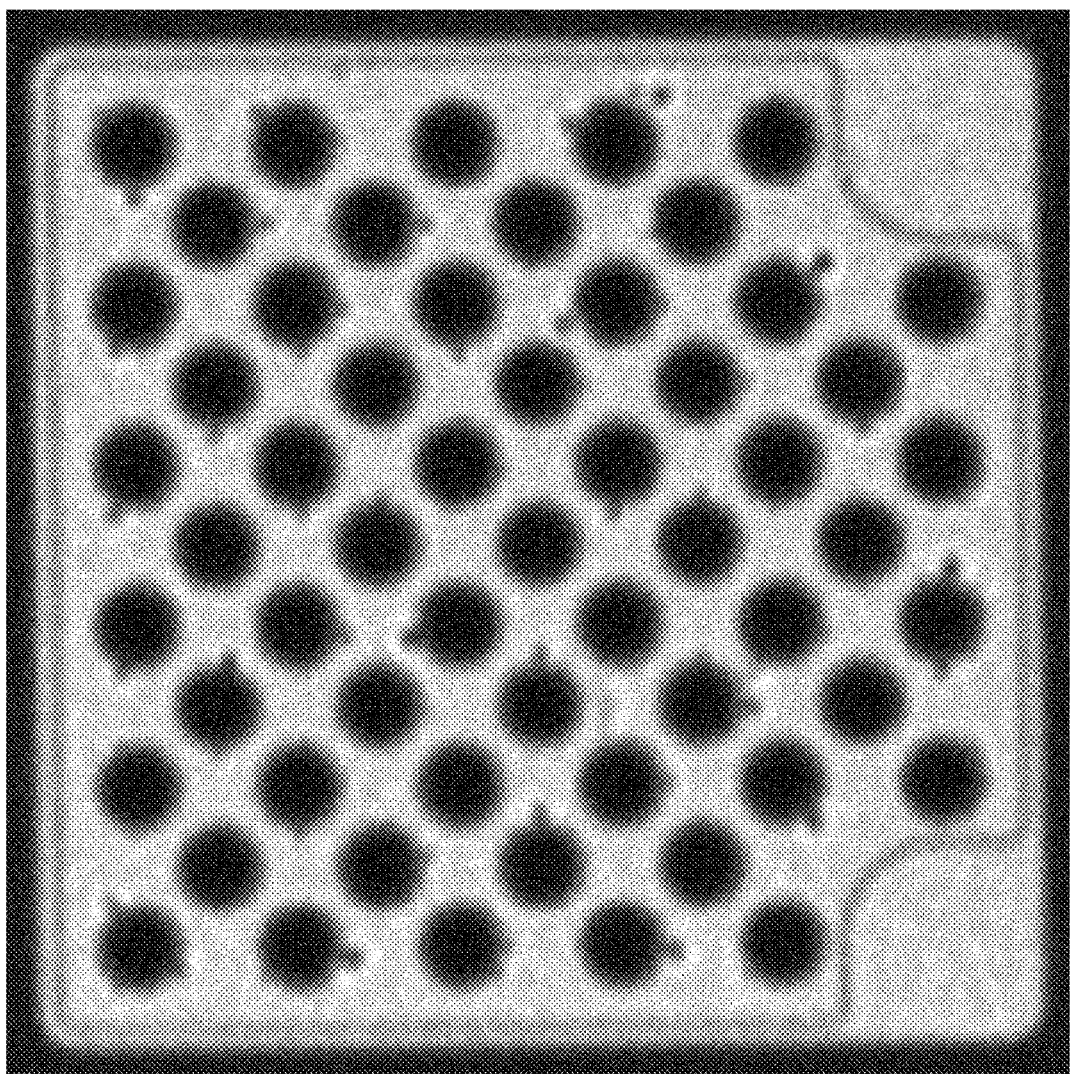

As illustrated in FIGS. 3A and 3B, in a case in which the first layer formed of titanium (Ti) of which a thermal expansion coefficient is 8.6 is formed on the second electrode including ITO of which a thickness is 30 nm, the interface between the second electrode and the second semiconductor layer may be delaminated due to a difference in thermal expansion coefficient therebetween so that the surface of the second insulating layer may be lifted and reliability of the light emitting device may be degraded. Particularly, as illustrated in FIGS. 3C and 3D, even in a case in which the second electrode includes ITO having the thickness of 10 or 60 nm, a problem of lifting of the surface of the second insulating layer occurs. That is, the problem of the lifting of the surface of the second insulating layer may occur regardless of the thickness of the second electrode.

Accordingly, in the light emitting device according to the embodiment of the present invention, the first layer 135a may be formed of a material of which a difference in thermal expansion coefficient with the second semiconductor layer 105c is small. For example, a difference in thermal expansion coefficient between the first layer 135a and the second semiconductor layer 105c may be 3 or less. The first layer 135a may be formed of a metal selected from Table 1.

TABLE 1

| Metal | Thermal Expansion Coefficient ($10^{-6}$/K) |
| --- | --- |
| Tungsten; W | 4.3 |
| Arsenic; As | 4.7 |
| Molybdenum; Mo | 5 |
| Osmium; Os | 5 |
| Cerium; Ce | 5.2 |
| Zirconium; Zr | 5.7 |
| Hafnium; Hf | 5.9 |
| Chromium; Cr | 6.2 |
| Iridium; Ir | 6.4 |
| Tantalum; Ta | 6.5 |

Specifically, since a thermal expansion coefficient of GaN, which is a base material of the second semiconductor layer 105c, is 3.94, the first layer 135a may be formed of one among the above-listed materials of which a difference in thermal expansion coefficient with the second semiconductor layer 105c is 3 or less.

Figure 4:
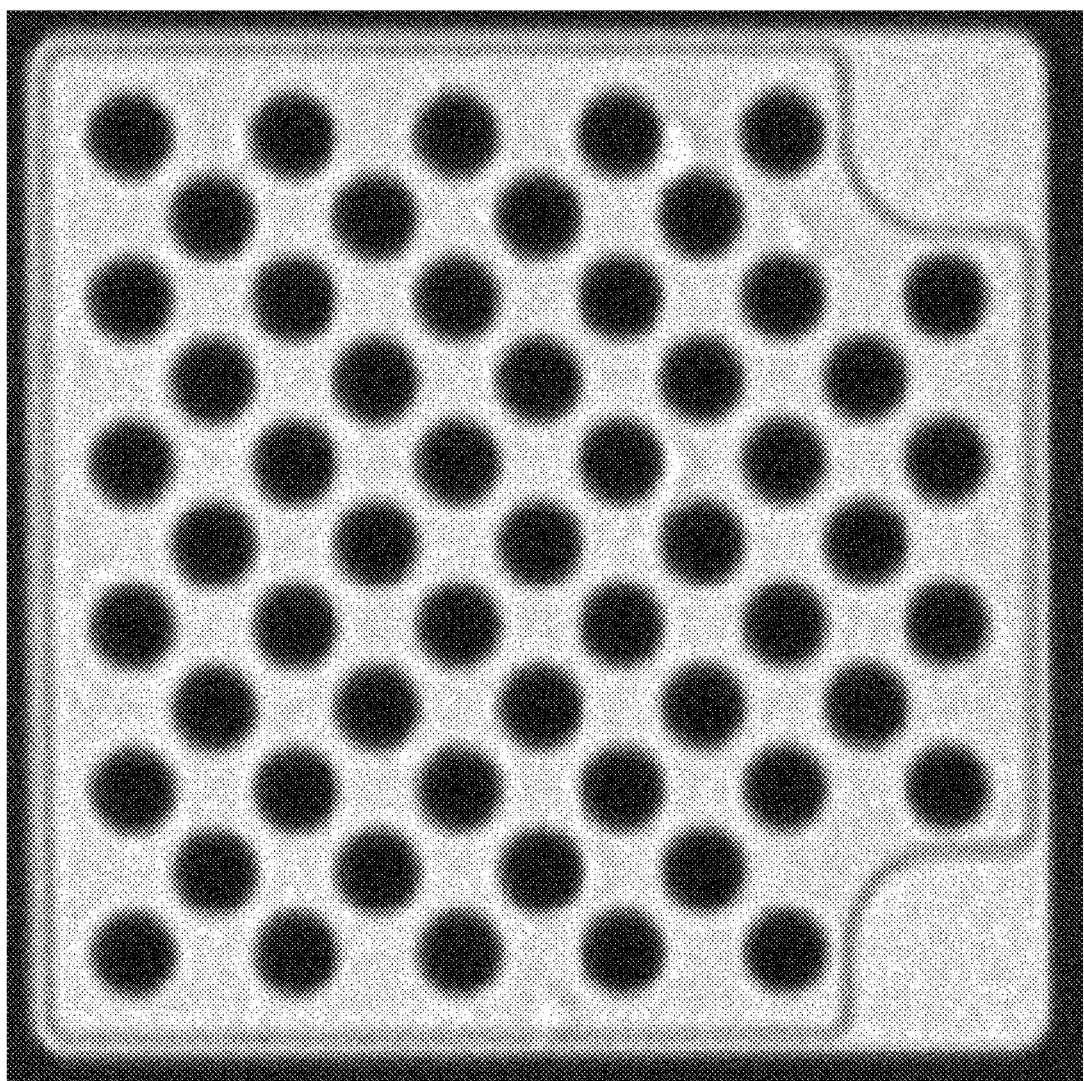
FIG. 4 is an image of the light emitting device according to the embodiment of the present invention captured from above.

FIG. 4 is an image of the light emitting device according to the embodiment of the present invention captured from above.

As illustrated in FIG. 4, in a case in which the first layer includes Cr of which a thermal expansion coefficient is 6.2 and the second electrode includes ITO of which a thickness is 30 nm, lifting of the surface of the second insulating layer is prevented. That is, since the first layer 135a including Cr is in direct contact with the second electrode 130 and is disposed to face the second semiconductor layer 105c with the electrode 130 interposed therebetween, a difference in thermal expansion coefficient therebetween can be decreased.

Accordingly, in the present invention, delamination of the interface between the second electrode 130 and the second semiconductor layer 105c which have a bonding characteristic therebetween less than that between the first layer 135a and the second electrode 130 may be prevented so that lifting of the surface of the second insulating layer 110b may be prevented. In addition, since the bonding electrode 120b of the above-described first electrode 120 is formed under the second insulating layer 110b, the bonding electrode 120b can be uniformly formed on the surface of the flat second insulating layer 110b.

Meanwhile, since a material having a low thermal expansion coefficient generally has low elasticity, in a case in which the first layer 135a is too thick, the first layer 135a is easily broken due to an external impact. In addition, in a case in the first layer 135a is too thin, an ohmic contact characteristic between the first layer 135a and the capping layer 135 may be degraded. Accordingly, a thickness $t_1$ of the first layer 135a may be in the range of 1 nm to 50 nm, but is not limited thereto.

The third layer 135c diffuses carriers injected from the electrode pad 145 and may be formed of a material having high electrical conductivity. For example, the third layer 135c may be formed of a material selected among Au, Pt, Cu, and the like. Particularly, the third layer 135c may have a thickness sufficient to diffuse carriers well, and a thickness $t_3$ of the third layer 135c may be in the range of 200 nm to 500 nm, but is not limited thereto.

A second layer 135b and a fourth layer 135d respectively disposed above and under a third layer 135c may serve as barrier layers to prevent migration of a material of the third layer 135c. The second layer 135b and the fourth layer 135d may be formed of Ni and the like. Thicknesses $t_2$ and $t_4$ of the second layer 135b and the fourth layer 135d may be in the range of 300 nm to 700 nm.

In addition, a fifth layer 135e improves a contact characteristic between the second insulating layer 110b and the capping layer 135 and may be formed of Ti, but is not limited thereto. A thickness $t_5$ of the fifth layer 135e may be in the range of 300 nm to 700 nm.

Although the capping layer 135 includes a total of five layers in the drawings, the capping layer 135 may also include three layers including the first layer 135a, the third layer 135c, and the fifth layer 135e.

Referring to FIG. 1 again, the second insulating layer 110b may be disposed to surround the capping layer 135, and may cover the fifth layer 135e as described above. Here, the second insulating layer 110b may expose the contact electrode 120a to electrically connect the contact electrode 120a and the bonding electrode 120b. In addition, the capping layer 135 may be electrically insulated from the bonding electrode 120b by the second insulating layer 110b.

In addition, the support substrate 140 may be disposed on a rear surface of the bonding electrode 120b, and the support substrate 140 may be a conductive substrate including a metal such as Au, Sn, In, Ag, Ni, Nb, Cu, and the like or an alloy thereof. That is, the support substrate 140 may support the light emitting structure 105, and may also be electrically connected to the first electrode 120 to serve as an electrode pad of the first electrode 120.

As described above, in the light emitting device according to the embodiment of the present invention, since the second electrode 130 includes ITO, an ohmic characteristic between the second semiconductor layer 105c and the second electrode 130 can be improved and a driving voltage can also be improved. In addition, since the capping layer 135 disposed to face the second semiconductor layer 105c with the second electrode 130 interposed therebetween has a material of which a difference in thermal expansion coefficient with the second semiconductor layer 105c is 3 or less, and the second electrode 130 is electrically connected to the capping layer 135 through the material, delamination and lifting of the interface between the second electrode 130 and the second semiconductor layer 105c can be prevented, and thus reliability of the light emitting device can be improved.

The above-described present invention is not limited to the above-described embodiments and the accompanying drawings, and it will be apparent to those skilled in the art that various substitutions, modifications, and changes are possible without departing from the technical spirit of the embodiment.

The invention claimed is:

1. A light emitting device comprising:
a support substrate;
a light emitting structure disposed on the support substrate and including a first semiconductor layer, a second semiconductor layer, and an active layer interposed between the first semiconductor layer and the second semiconductor layer;
at least one groove which passes through the second semiconductor layer and the active layer and exposes the first semiconductor layer;
a first electrode interposed between the light emitting structure and the support substrate and electrically connected to the exposed first semiconductor layer;
a second electrode in contact with and electrically connected to the second semiconductor layer;
a capping layer interposed between the support substrate and the light emitting structure and electrically connected to the second electrode; and
an insulating layer is interposed between the first electrode and the second electrode and electrically insulates the first electrode from the second electrode,
wherein the capping layer is disposed to face the second semiconductor layer with the second electrode interposed therebetween and includes a first layer having a material of which a difference in thermal expansion coefficient with the second semiconductor layer is 3 or less,
wherein the capping layer extend outside the light emitting structure and is electrically connected to an electrode pad and includes the first layer, a second layer which diffuses carriers injected from the electrode pad, and a third layer,
wherein the second layer and the third layer are sequentially stacked on the first layer,
wherein the third layer is disposed closer to the support substrate than the first layer,
wherein a thickness of the second electrode is greater than a thickness of the first layer, wherein the thickness of the second electrode is 200 nm or less,
wherein the thickness of the first layer that contacts the second electrode is in a range of 1 nm to 50 nm,
wherein a thickness of the second layer is greater than a thickness of the first layer and the second electrode,
wherein a thickness of the third layer is greater than a thickness of the first layer and the second electrode,
wherein the first layer includes a material selected among chromium (Cr), tungsten (WN), arsenic (As), molybdenum (Mo), osmium (Os), cerium (Ce), zirconium (Zr), hafnium (Hf), iridium (Ir) and tantalum (Ta),
wherein the second layer includes a material selected among gold (Au), platinum (Pt), and copper (Cu), and
wherein the third layer includes titanium (Ti), wherein the light emitting structure includes AlGaN and emits light in an ultraviolet wavelength band, wherein the insulating layer includes a first insulating layer disposed on a side surface of the groove, and a second insulating layer interposed between the first insulating layer and the first electrode, the second insulating layer surrounds the capping layer, the second electrode, and the first insulating layer, and wherein the third layer is disposed between the support substrate and the second layer, and the third layer contacts the second insulating layer.

2. The light emitting device of claim 1, wherein:
the groove includes a bottom surface, and the side surface which extends from the bottom surface and exposes the first semiconductor layer, the active layer, and the second semiconductor layer.

3. The light emitting device of claim 2, wherein:
the second electrode covers a part of the first insulating layer.

4. The light emitting device of claim 3, wherein at least a part of the second electrode is interposed between the first insulating layer and the second insulating layer.

5. The light emitting device of claim 3, wherein the first electrode incudes:
a contact electrode disposed on the bottom surface; and
a bonding electrode interposed between the capping layer and the support substrate and electrically connected to the contact electrode.

6. The light emitting device of claim 5, wherein the contact electrode is disposed to be spaced apart from the first insulating layer and in contact with the exposed first semiconductor layer.

7. The light emitting device of claim 6, wherein a separation distance between the contact electrode and the first insulating layer is in a range of 0.5 µm to 2 µm.

8. The light emitting device of claim 6, wherein the second insulating layer covers a part of the contact electrode.

9. The light emitting device of claim 6, wherein the bonding electrode is disposed under the second insulating layer.

10. The light emitting device of claim 1, wherein the second electrode includes indium tin oxide (ITO).

11. The light emitting device of claim 1, wherein the capping layer further includes barrier layers between the first layer and the second layer and between the second layer and the third layer.

12. The light emitting device of claim 11, wherein a thickness of the second layer is in a range of 200 nm to 500 nm.

13. The light emitting device of claim 11, wherein thicknesses of the barrier layers are in a range of 300 nm to 700 nm.

14. The light emitting device of claim 11, wherein a thickness of the third layer is in a range of 300 nm to 700 nm.

15. The light emitting device of claim 1, wherein the first electrode is electrically insulated from the second electrode and the capping layer.

16. The light emitting device of claim 1, wherein the support substrate is electrically connected to the first electrode.

* * * * *